United States Patent
Suehira et al.

(10) Patent No.: US 8,011,916 B2
(45) Date of Patent: Sep. 6, 2011

(54) MOLD, IMPRINT APPARATUS, AND PROCESS FOR PRODUCING STRUCTURE

(75) Inventors: Nobuhito Suehira, Kawasaki (JP); Junichi Seki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 797 days.

(21) Appl. No.: 11/468,870

(22) Filed: Aug. 31, 2006

(65) Prior Publication Data

US 2007/0054097 A1    Mar. 8, 2007

(30) Foreign Application Priority Data

Sep. 6, 2005    (JP) .................... 2005/257431

(51) Int. Cl.
*B29C 59/00* (2006.01)
*B29C 35/08* (2006.01)

(52) U.S. Cl. ............. 425/385; 425/174.4; 425/135; 264/293

(58) Field of Classification Search ........... 425/385, 425/174.4, 135; 264/293
See application file for complete search history.

(56) References Cited

U.S. PATENT DOCUMENTS

| | | | |
|---|---|---|---|
| 5,885,514 A * | 3/1999 | Tensor | 264/478 |
| 6,641,981 B1 | 11/2003 | Kaneko et al. | |
| 6,653,030 B2 * | 11/2003 | Mei et al. | 430/5 |
| 6,696,220 B2 * | 2/2004 | Bailey et al. | 425/385 |
| 6,780,001 B2 * | 8/2004 | Eldridge et al. | 425/385 |
| 2002/0076654 A1 | 6/2002 | Hasegawa et al. | |
| 2004/0022888 A1 | 2/2004 | Sreenivasan et al. | |
| 2004/0131718 A1 * | 7/2004 | Chou et al. | 425/385 |
| 2005/0026090 A1 | 2/2005 | Liao et al. | |
| 2006/0198917 A1 * | 9/2006 | Ho et al. | 425/174.4 |
| 2006/0266916 A1 | 11/2006 | Miller et al. | |
| 2006/0280829 A1 * | 12/2006 | Kruijt-Stegeman et al. | 425/385 |
| 2007/0090574 A1 | 4/2007 | Terasaki et al. | |

FOREIGN PATENT DOCUMENTS

| | | |
|---|---|---|
| CN | 1434349 A | 8/2003 |
| EP | 0 614 124 A2 | 9/1994 |
| EP | 1 331 516 A2 | 7/2003 |
| JP | 2003-272998 | 9/2003 |
| WO | 2006/127091 A2 | 11/2006 |

OTHER PUBLICATIONS

European Search Report in Application No. EP 06120143.0.
Hiroshi Hiroshima et al., "Step-and-Repeat Photo-Nanoimprint System Using Active Orientation Head," 43(6B) Jpn. J. Appl. Phys. 4012-16 (Jun. 2004).
Extended European Search Report in European Application No. 08153570 (Jun. 5, 2008).
Stephen Y. Chou et. al., "Imprint of Sub-25 nm Vias and Trenches in Polymers," 67(21) Appl. Phys. Lett. 3114-16 (1995).
U.S. Appl. No. 11/627,022, filed Jan. 25, 2007.

* cited by examiner

*Primary Examiner* — Maria Veronica D Ewald
(74) *Attorney, Agent, or Firm* — Fitzpatrick, Cella, Harper & Scinto

(57) ABSTRACT

In order to alleviate or suppress curing of a photocurable resin material in an area in which the curing of the photocurable resin material is not intended, exposure of the photocurable resin material to light is suppressed through a non-pattern portion at which a light-blocking member is provided by means of a mold having an imprint pattern portion and the non-pattern portion or is suppressed by disposing a light-blocking member so as not to irradiate the photocurable resin material with light not via the mold.

2 Claims, 7 Drawing Sheets

MOLD, IMPRINT APPARATUS, AND PROCESS FOR PRODUCING STRUCTURE

FIELD OF THE INVENTION AND RELATED ART

The present invention relates to a mold having a shape that is to be transferred onto a work or workpiece (member to be processed). The present invention also relates to an imprint apparatus and a process for producing a structure.

In recent years, as described in Stephan Y. Chou et al., Appl. Phys. Lett., Vol. 67, Issue 21, pp. 3114-3116 (1995), fine processing technology for transferring a minute structure on a mold onto a work comprising a semiconductor, glass, resin, metal, etc., has been developed and has received attention.

Because this technology provides a resolution on the order of several nanometers, it is called nanoimprint (nanoimprinting) or nanoembossing. Although the nanoimprint has the above-described resolution, it is also suitably used for processing members having minimum processing widths of not more than 1 mm, not more than 1 µm, and not more than 100 nm. Further, according to the nanoimprint, it is possible to simultaneously process an area having a processing width of not more than 100 nm and an area having a processing width of not more than 1 µm with respect to a work. In other words, the nanoimprint has such an advantage, compared with a processing of a work by photolithography, that processing of the work can be performed in a plurality of areas having processing widths that differ by not less than one digit, more preferably not less than three digits, at the same time.

This technology can be employed not only in the production of a semiconductor device, but also in batch processing of a three-dimensional structure at a wafer level. For this reason, the nanoimprint has been expected to be applied to a wide variety of fields, e.g., production technologies for an optical device, such as a photonic crystal, a micro total analysis system (µ-TAS), a biochip, etc.

The case where a semiconductor device as a structure is produced through a photoimprint method will be described.

First, a layer of photocurable resin material is formed on a substrate (e.g., a semiconductor wafer).

Next, a mold (or template) on which a desired imprint structure is formed is brought into contact with the resin layer. In this state, the resin layer is irradiated with ultraviolet light to cure the photocurable resin material.

As a result, an imprint pattern of the above-described imprint structure on the resin layer is inverted. This is referred to as a transfer of an imprint structure.

Further, by using the resin layer as an etching mask, e.g., etching of the substrate surface is effected to transfer the imprint structure onto the substrate.

As described above, different from a conventional processing method using a light exposure apparatus, the imprint (method) permits transfer of the minute structure provided on the mold onto the work.

During the processing by the imprint, the photocurable resin material flowing from the mold is adhered to the mold on its lateral side. The photocurable resin material adhered to the lateral side of the mold is cured, together with the photocurable resin material located at a portion at which the imprint structure (imprint pattern) is to be formed, by light passing through the outside of the mold during light exposure. By such curing, a large force acts on the mold or the work during a release of the mold from the work to damage the mold or the work.

Further, in some cases, the photocurable resin material outside the portion at which the imprint pattern is to be formed is excessively exposed to light passing through the outside of the imprint pattern portion formed in the mold during light exposure and deforms into an undesirable shape. Particularly, in such a case where a resin material is applied onto a substrate by spin coating and processing of a work is repeated by a step-and-repeat method, the portion at which the imprint pattern is to be formed is exposed to light before the processing.

SUMMARY OF THE INVENTION

An object of the present invention is to provide a mold capable of alleviating or suppressing curing of a photocurable resin material in an area in which the curing of the photocurable resin material is not intended.

Another object of the present invention is to provide a pressure processing apparatus using the mold and a production process of a structure using the pressure processing apparatus.

According to an aspect of the present invention, there is provided a mold for use in an imprint apparatus in which a photocurable member to be processed is processed by irradiation, through a mold having an imprint pattern, with light for curing the member to be processed in a state in which the mold is brought into contact with the member to be processed, the mold comprising:

a processing side having an imprint pattern;

a back side opposite from the processing side; and a non-pattern portion at which the imprint pattern is not provided;

wherein the mold further comprises a light-blocking member, disposed at the non-pattern portion, for decreasing an amount of light with which the member to be processed is irradiated through the non-pattern portion.

According to another aspect of the present invention, there is provided an imprint apparatus for processing a photocurable member by irradiation, through a mold having an imprint pattern, with light for curing the member to be processed in a state in which the mold is brought into contact with the member to be processed, the apparatus comprising:

a mold comprising a processing side having an imprint pattern, a back side opposite from the processing side, and a non-pattern portion at which the imprint pattern is not provided; and an exposure light source;

wherein the mold further comprises a light-blocking member disposed at the non-pattern portion so as to decrease an amount of light with which the member to be processed is irradiated through the non-pattern portion.

According to another aspect of the present invention, there is provided an imprint apparatus for processing a photocurable member to be processed by irradiation, through a mold having an imprint pattern, with light for curing the member to be processed in a state in which the mold is brought into contact with the member to be processed, the apparatus comprising:

a light source for generating the light; and a mold holding portion for holding the mold;

wherein the apparatus further comprises a light-blocking member for decreasing an amount of light with which the member to be processed is irradiated from the light source not through the mold.

According to another aspect of the present invention, there is provided a process for producing a structure, comprising:

applying a photocurable resin material as a member to be processed onto a substrate; and forming a resin layer having an imprint pattern by curing the photocurable resin material with the imprint apparatus described above.

According to a further aspect of the present invention, there is provided a process for producing a structure, comprising:

applying a photocurable resin material as a member to be processed onto a substrate;

forming a resin layer having an imprint pattern by curing the photocurable resin material with the imprint apparatus described above;

etching the substrate by using the resin layer having the imprint pattern as a mask; and removing the resin layer remaining on the substrate after the etching.

According to a still further aspect of the present invention, there is provided a process for producing a structure, comprising:

preparing the imprint apparatus described above; and curing a specific portion of photocurable resin material located in a processing area to effect transfer of a pattern formed on a processing side of a mold.

Using the above-described light-blocking member, according to the present invention, it is possible to alleviate or suppress the curing of the photocurable resin material in an area other than a portion at which the imprint pattern is to be formed by processing.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

In an embodiment of the present invention, a mold having an imprint pattern can be constituted in the following manner.

Figure 1A:
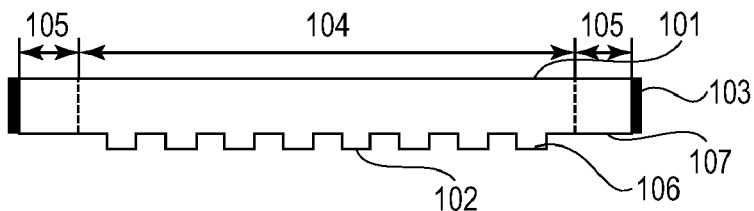
FIGS. 1A to 1H are schematic views each showing a constitution of a mold according to an embodiment of the present invention.

FIG. 1A shows a cross-section of the mold in this embodiment.

Referring to FIG. 1A, the mold includes a transparent member 101, a processing side 102, a light-blocking member 103, an imprint pattern portion 104, and a non-pattern portion 105. Incidentally, broken lines between the imprint pattern portion 104 and the non-pattern portion 105 in the figure are depicted for indicating a boundary therebetween for convenience of an explanation.

The mold has a first surface 106 and a second surface 107. The first surface 106 constitutes the processing side 102 having an imprint pattern and the second surface 107 constitutes a side identical in location to the processing side 102 having the imprint pattern at the imprint pattern portion 104.

As shown in FIG. 1A, in the case of providing the non-pattern portion 105 so as to be adjacent to the imprint pattern portion 104, the light-blocking member 103 is provided at least at any one of the side 107 identical in location to the processing side 106 having the imprint pattern at the non-pattern portion 105, a side identical in location to back side at the non-pattern portion 105, and a lateral side of the mold at the non-pattern portion.

In the case where the non-pattern portion 105 is not provided to the mold, as described below, the light-blocking member may be disposed at the lateral side of the mold. In this case, the mold itself can be regarded as the non-pattern portion.

The light-blocking member used in the present invention may include not only the one, which completely blocks light capable of curing a photocurable resin material constituting at least a part of a work, but also the one, which does not completely block the light. In the latter case, the light-blocking member may only be required to provide a necessary difference in the degree of curing of the photocurable resin material between an area in which the light is not blocked and an area in which the light is blocked.

In another embodiment of the present invention, as described later, it is preferable that an imprint apparatus includes a light-blocking member (light-blocking means) for blocking light with which a member to be processed is irradiated from an exposure light source not through the mold.

According to this embodiment of the present invention, it is possible to alleviate or suppress the curing of the photocurable resin material in the neighborhood of the lateral side of the mold. Further, the mold may be constituted by providing the light-blocking member so that the photocurable resin material close to the lateral side of the mold during processing is not cured or is less cured than that located in the imprint pattern portion.

In the case where the processing is performed by a step-and-repeat method, only a photocurable resin material (uncured resin material) in a specific processing area of a work (member to be processed) is exposed, so that an uncured resin material in an area to be subsequently processed is prevented from being exposed to light.

The step-and-process method may, e.g., be the following method.

First, a work is prepared by coating an entire surface of a substrate with a photocurable resin material. Next, a part of the surface of the work is irradiated with light in a state in which the mold is brought into contact with the work, whereby the photocurable resin material only at the part of the surface of the substrate is cured. Thereafter, the mold is removed from the work. These steps are repetitively performed with respect to another part of the surface of the substrate while moving the work in an in-plane direction of the work.

Herein, the photocurable resin material after being cured by light irradiation is no longer the photocurable resin material, but is inclusively referred to, sometimes, as the photocurable resin material for convenience.

Another embodiment of the present invention will be described below. As described above, the object of the present invention is to suppress or alleviate the curing of the photocurable resin material in an area in which the curing of the photocurable resin material is not intended. Thus, the present invention is not limited to the following embodiment.

Here, the area in which the curing of the photocurable resin material is not intended means, e.g., the following areas in the case where a mold has an imprint pattern portion and a non-pattern portion adjacent to the imprint pattern portion. More specifically, examples of such areas may include an area of the photocurable resin material at the non-pattern portion, an area of the photocurable resin material in the neighborhood of an outer periphery portion (lateral side) of the mold, and an area of the photocurable resin material located at an outer lateral side of the mold during contact with the photocurable resin material.

Embodiments of the Mold

With reference to FIGS. 1B to 1H, constitutions of molds according to several embodiments of the present invention will be described.

In these figures, the same members or portions identical to those in FIG. 1A are represented by identical reference numerals.

Figure 1B:
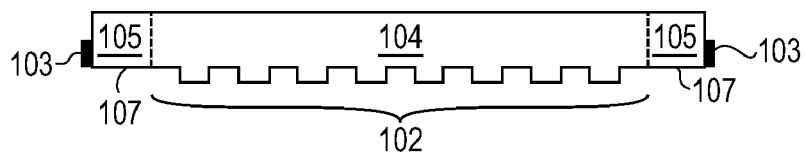

FIG. 1B shows a constitution in which the light-blocking member 103 is disposed only at a lower portion of the lateral side of the mold.

Figure 1C:
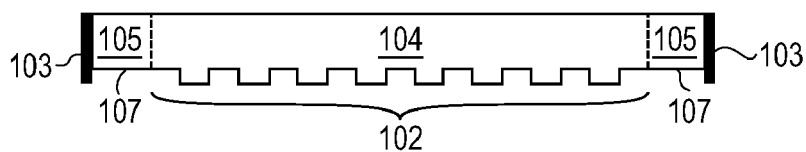

FIG. 1C shows a constitution in which the light-blocking member protrudes downward from the lateral side of the mold.

In the above-described constitution, a light-blocking effect is further enhanced in the case of FIG. 1A, i.e., in the case where a level of the lateral side of the mold does not reach the same level as a (lower) surface of the projection constituting the imprint pattern at the imprint pattern portion 104. Further, in the case of FIG. 1C, a length of the protruded portion of the light-blocking member from the lateral side of the mold may desirably be not more than a distance between the surface of the projection of the imprint pattern portion 104 and the surface 107 identical in location to the processing side of the mold at the non-pattern portion 105.

Figure 1D:
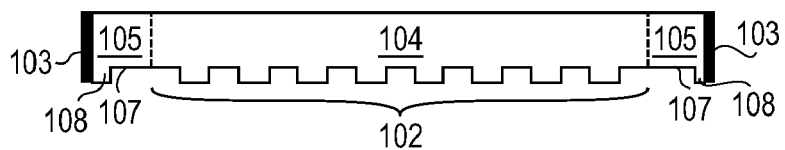

FIG. 1D shows a constitution in which a reinforcing member 108 for reinforcing the light-blocking member 103 is provided. For example, in some cases, the light-blocking member 103 has a thickness of approximately 50 nm. In this case, when the light-blocking member does not have a sufficient strength, it is possible to prevent a breakage at the lower portion of the light-blocking member 103 by reinforcing the lower portion with the reinforcing member 108.

Figure 1E:
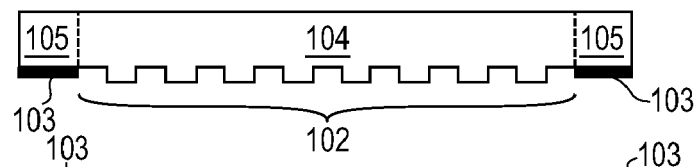

FIG. 1E shows a constitution in which the light-blocking member 103 is disposed at a lower side (surface) 107. In this case, the light-blocking member 103 may desirably have a thickness of not more than the distance between the surface of the projection of the imprint pattern portion 104 and the surface 107 identical in location to the processing side of the mold.

Figure 1F:
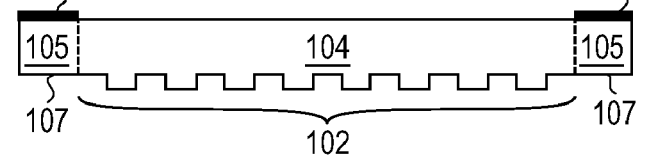

FIG. 1F shows a constitution in which the light-blocking member 103 is disposed on a back side (upper side) at the non-pattern portion 105.

Figure 1G:
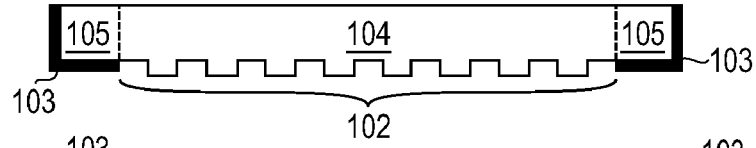

FIG. 1G shows a constitution in which the light-blocking member 103 is disposed at the lower side (surface) 107 in addition to the lateral side of the mold. In this case, at the lower side 107, the light-blocking member 103 may desirably have a thickness of not more than the distance between the surface of the projection of the imprint pattern portion 104 and the surface 107 identical in location to the processing side of the mold.

Figure 1H:
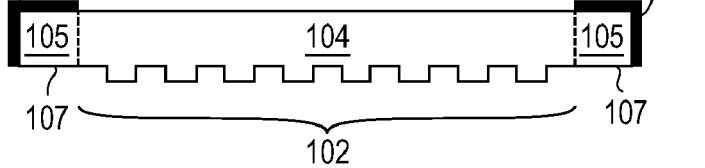

FIG. 1H shows a constitution in which the light-blocking member 103 is disposed on the back side (upper side) at the non-pattern portion 105 in addition to the lateral side of the mold.

Further, another embodiment of the present invention will be described with reference to FIGS. 7A to 7D.

Different from the molds shown in FIGS. 1A to 1H, those shown in FIGS. 7A to 7D are of such a projection type wherein a third side is provided between the processing side and the back side.

Figure 7A:
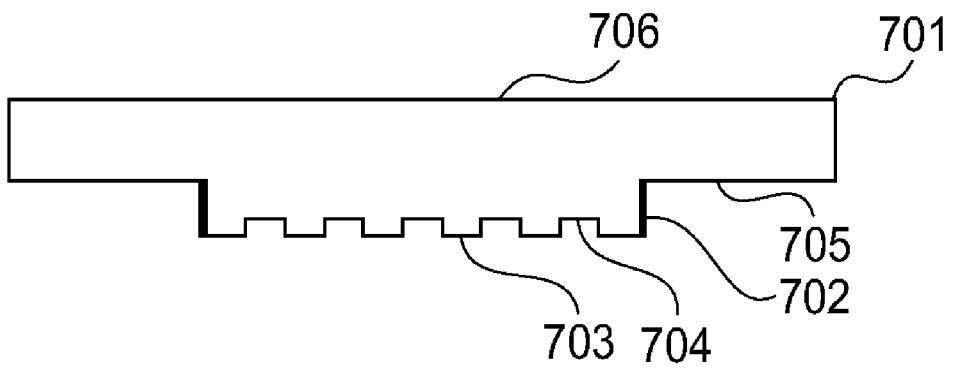
FIGS. 7A to 7D are schematic views each showing a constitution of a projection-type mold according to another embodiment of the present invention.
Figure 7B:
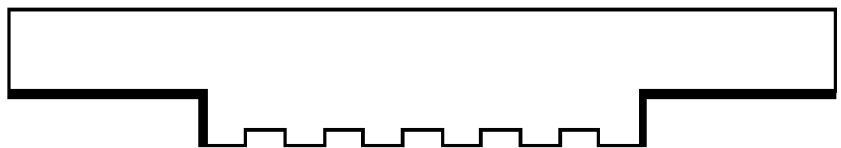
Figure 7C:
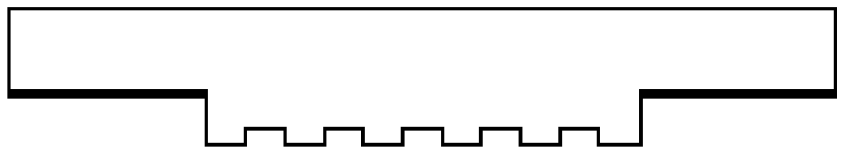
Figure 7D:
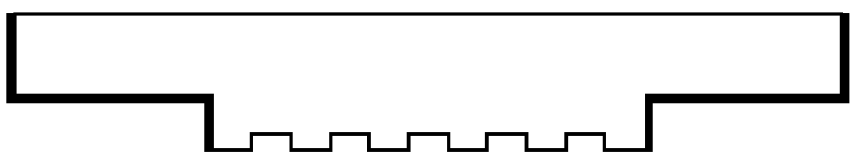

Referring to FIG. 7A, the mold includes a transparent member 701, a light-blocking member 702, a third side 703, a second side 704, a third side 705, and a back side 706. In FIG. 7B, the light-blocking member 702 is disposed on the lateral side located between the first side 703 and the third side 705 and is disposed on the third side 705. In FIG. 7C, the light-blocking member 702 is disposed on the third side 705. In FIG. 7D, the light-blocking member 702 is disposed on the lateral side located between the first side 703 and the third side 705, on the third side 705, and on the lateral side located between the third side 705 and the back side 706.

Next, a preparation method of the above-described mold will be described with reference to FIGS. 2A and 2B, each showing steps for providing a light-blocking member 203 on a lateral side of a substrate 201 formed of a transparent member for a mold. On the substrate 201, a resist 202 is to be disposed.

Herein, the mold substrate 201 has a front side as a processing side to be subjected to processing, a back side opposite from the front side (processing side), and a lateral side connecting the front side and the back side.

Figure 2A:
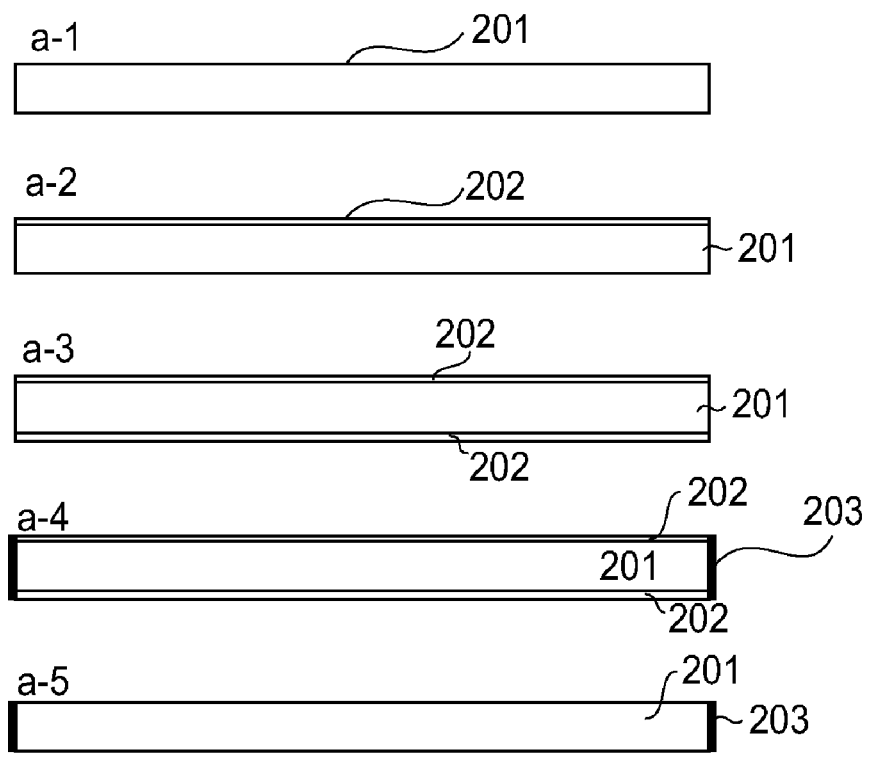
FIGS. 2A and 2B are schematic views each showing a preparation method of a mold provided with a light-blocking member.

First, the preparation method of the mold by vapor deposition will be described with reference to FIG. 2A showing steps a-1 to a-5.

In step a-1, the substrate 201 is prepared. The substrate 201 may be formed of a light-transmissive substance including heat-resistant glass, such as quartz glass or Pyrex (registered trademark), and sapphire.

Next, in step a-2, a negative resist 202 is applied onto the processing side of the substrate 201 by a spin coater or the like and is irradiated with light to be modified so that it is not readily dissolved in a developing solution.

Next, in step a-3, a negative resist 202 is applied onto the back side of the substrate 201 by a spin coater or the like and is irradiated with light to be modified so that it is not readily dissolved in a developing solution.

When the resist is adhered to the lateral side of the substrate, it can be removed by, e.g., polishing. Further, in steps a-2 and a-3, the coating may also be performed after a film-like mask is provided on the lateral side of the substrate so that the resist is not adhered to the lateral side of the substrate.

Next, in step a-4, a light-blocking member 203 is provided on the lateral side of the substrate. The light-blocking member 203 is vapor-deposited in a layer (film) of a metal, such as Cr, on the lateral side of the substrate by sputtering, chemical vapor deposition (CVD), vacuum vapor deposition, ion plating, etc. The resultant metal film is only required to sufficiently block ultraviolet (UV) light and may desirably have a thickness of not more than 50 nm. Further, the light-blocking member 203 may be formed of organic materials of an acrylic type, a urethane type, a polycarbonate type, etc., or of inorganic materials of a carbon type, etc. These materials may further contain other materials, such as a colorant.

Next in step a-5, the resist 202 is removed from the substrate 201 to complete the substrate 201 with the light-blocking member 203.

Then, the surface of the substrate 201 is processed by a method described below to form an imprint pattern (not shown).

Figure 2B:
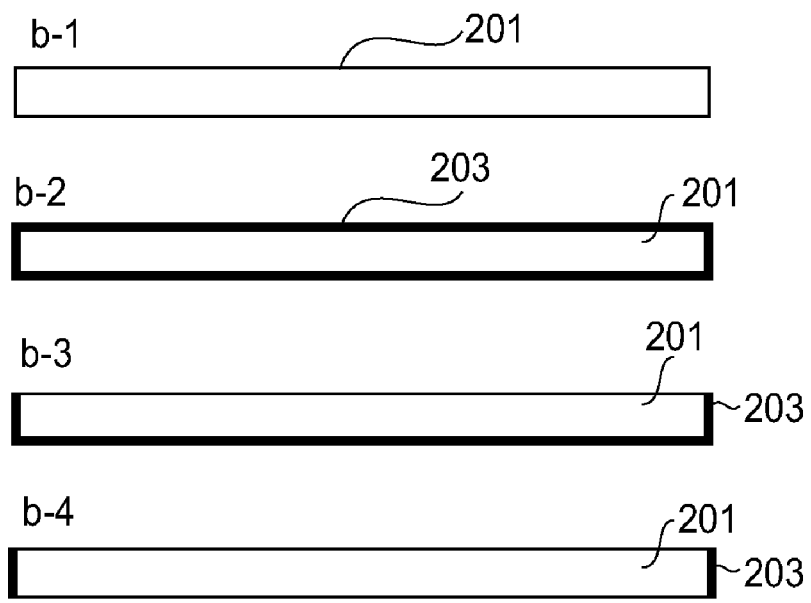

Next, the preparation method of the mold by polishing will be described with reference to FIG. 2B showing steps b-1 to b-4.

First, in step b-1, a substrate 201 is prepared.

Next, in step b-2, a light-blocking member 203 is disposed on the substrate 201 by dipping the substrate 201 in or coating the substrate 201 with a solution containing a material constituting the light-blocking member 203 or its precursor. Then, the light-blocking member 203 is fixed on the substrate 201 by removing the solvent. In the case where the light-blocking member 203 is provided only at a part of lateral side of the substrate 201, dipping of the substrate 201 may be effected to a necessary depth.

The light-blocking member 203 may be formed of the same material as those described with reference to FIG. 2A.

Next, in step b-3, the light-blocking member 203 formed on a back side of the substrate 201 is removed by polishing the back side of the substrate 201 through chemical mechanical polishing (CMP), etc.

Next, in step b-4, a front side of the substrate 201 is polished to complete the substrate 201 provided with the light-blocking member 203 on the lateral side of the substrate 201.

Incidentally, the light-blocking member 203 is not limited to those formed by the above-described liquid phase deposition or vapor phase deposition, but may also be formed by adhering a film-like light-blocking substance or a plate-like light-blocking substance to the substrate 201.

Further, it is also possible to provide a mask in advance at a position where the light-blocking member 203 is not intended to be formed.

Further, the steps b-2 and b-3 may also be repeated in several cycles.

It is also possible to use the methods shown in FIG. 2A and FIG. 2B in combination.

The processing side of the thus prepared substrate having the light-blocking member is subjected to formation of the imprint pattern through an ordinary patterning method, such as photolithography, electron beam lithography, focused ion beam (FIB) processing, or X-ray lithography, thus completing the mold.

Incidentally, the light-blocking member may also be formed after the imprint pattern is formed on the processing side of the substrate.

Effect of the Imprint Apparatus

A constitutional example of an imprint apparatus according to an embodiment of the present invention will be described.

Figure 3A:
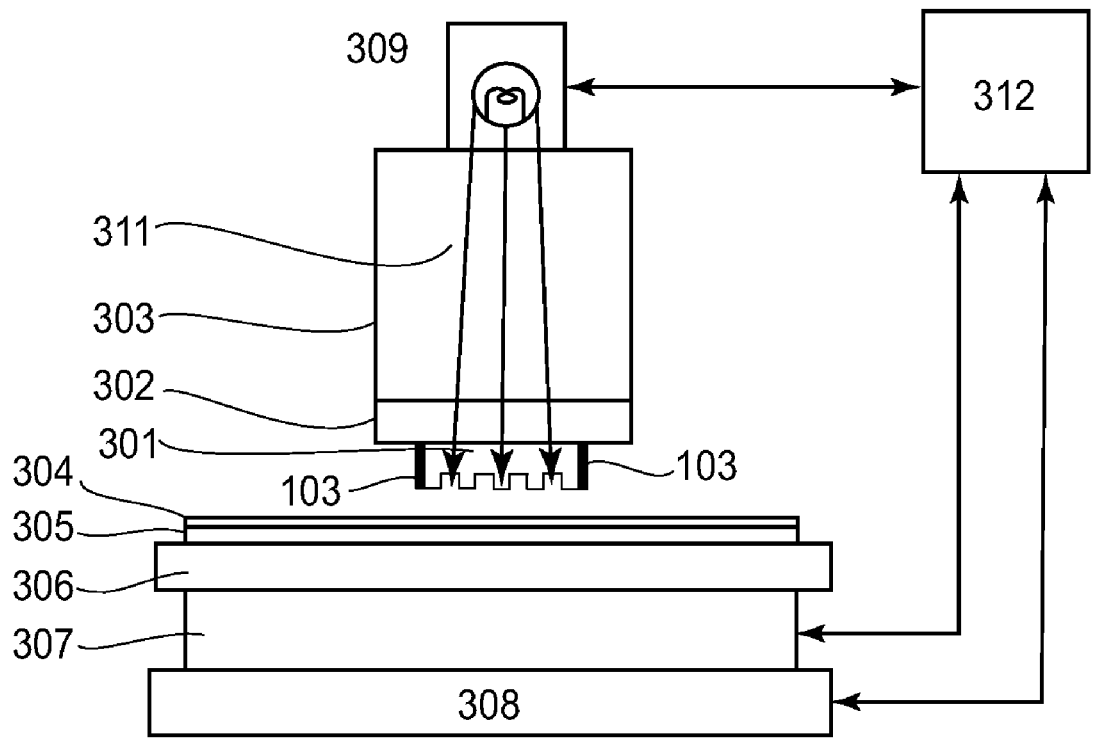
FIGS. 3A and 3B are schematic views each showing an example of a constitution of an imprint apparatus according to an embodiment of the present invention.

FIG. 3A shows the constitutional example of the imprint apparatus in this embodiment.

Referring to FIG. 3A, the imprint apparatus may include a mold 301, a mold holding portion 302, a body tube 303, a photocurable resin material 304, a substrate 305, a work holding portion 306, a work pressing mechanism 307, an XY moving mechanism 308, an exposure light source 309, a light-blocking member 310, exposure light 310, and an imprint control mechanism 312.

The imprint apparatus in this embodiment is principally constituted by the mold holding portion 302, the work holding portion 306, the work pressing mechanism 307, the XY moving mechanism 308, the exposure light source 309, and the imprint control mechanism 312. On the work holding portion 306, a work (member to be processed) constituted by the substrate 305 coated with the photocurable resin material 304 by a coating method, such as spin coating or slit coating, is disposed. The imprint apparatus further includes a position detection apparatus for effecting the alignment, which is not shown and is omitted from the explanation.

The mold holding portion 302 effects chucking of the mold 301 by a vacuum chucking method or the like. The work is movable to a desired position by the XY moving mechanism 308, and the work pressing mechanism 307 can effect a height adjustment (level control) and pressing of the work. The exposure light 311 from the exposure light source 309 passes through the body tube 303 and reaches the mold 301. The light 311 is restricted so as not to reach the outside of the mold 301 by limiting light fluxes with a lens or a diaphragm. The position movement, pressing, and light exposure of the work are controlled by the imprint control mechanism 312.

The mold 301 shown in FIG. 3A in this embodiment is constituted by a transparent member and is provided with a light-blocking member 103 on an entire lateral side (non-pattern portion) of the mold 301. As a result, it is possible to prevent the light 311 from reaching the outside of the mold 301 through the mold 301, so that it is possible to prevent the photocurable resin material 304 from being cured at a portion outside the mold 301 and being excessively exposed to light at the portion outside the mold 301. Particularly, an in-plane area of the work, which has not been subjected to processing, cannot be exposed to light, so that it is possible to prevent a phenomenon in which the photocurable resin material 304 in the in-plane area (before processing) is cured so as not to permit a transfer of the imprint pattern of the mold 301.

Figure 3B:
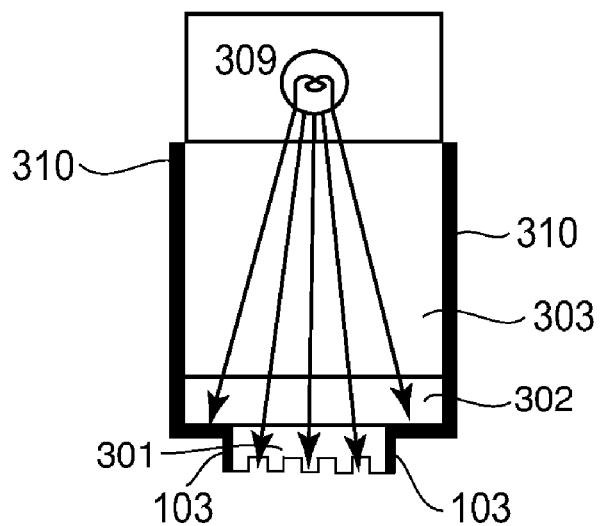

FIG. 3B shows another example of the body tube 303, which is constituted in the following manner.

As shown in FIG. 3B, the light-blocking member 310 is provided at necessary portions of the body tube 303 and the mold holding portion 302, so that the exposure light reaching a portion other than a necessary portion for exposure not through the mold, i.e., the so-called stray light is completely blocked. By employing such a constitution, it is possible to prepare the body tube 303 and the mold holding portion 302 with a light-transmissive material. Further, it is not necessary to limit an irradiation range of the light from the light source 309 by the lens or diaphragm.

The exposure light emitted from the light source 309 passes through the mold to reach the back side of the mold. Even when light fluxes of the exposure light from the light source travel in a divergent manner, in parallel lines, or in a convergent manner, they are reflected or scattered by various members in some cases depending on a constitution of the imprint apparatus. Further, there is also a possibility that the exposure light leaks from a gap between the members.

In these cases, by adopting the constitution as shown in FIG. 3B, it is possible to further enhance the light-blocking effect. More specifically, the light-blocking member 310 is provided at necessary portions of the body tube 303 and the mold holding portion 302, i.e., on the lateral side of the body tube 303 and the lateral side and the peripheral lower side of the mold holding portion 302, thus completely blocking the exposure light from reaching portions other than the necessary portions. By using the light-blocking member 310 and the light-blocking member 103 for the mold 301 in combination, an area to be exposed to light of the work is restricted to an area identical to the lower side (processing side) of the mold at the imprint pattern portion.

Embodiment of the Production Process of the Structure

A process for producing a structure according to an embodiment of the present invention will be described.

Figure 4A:
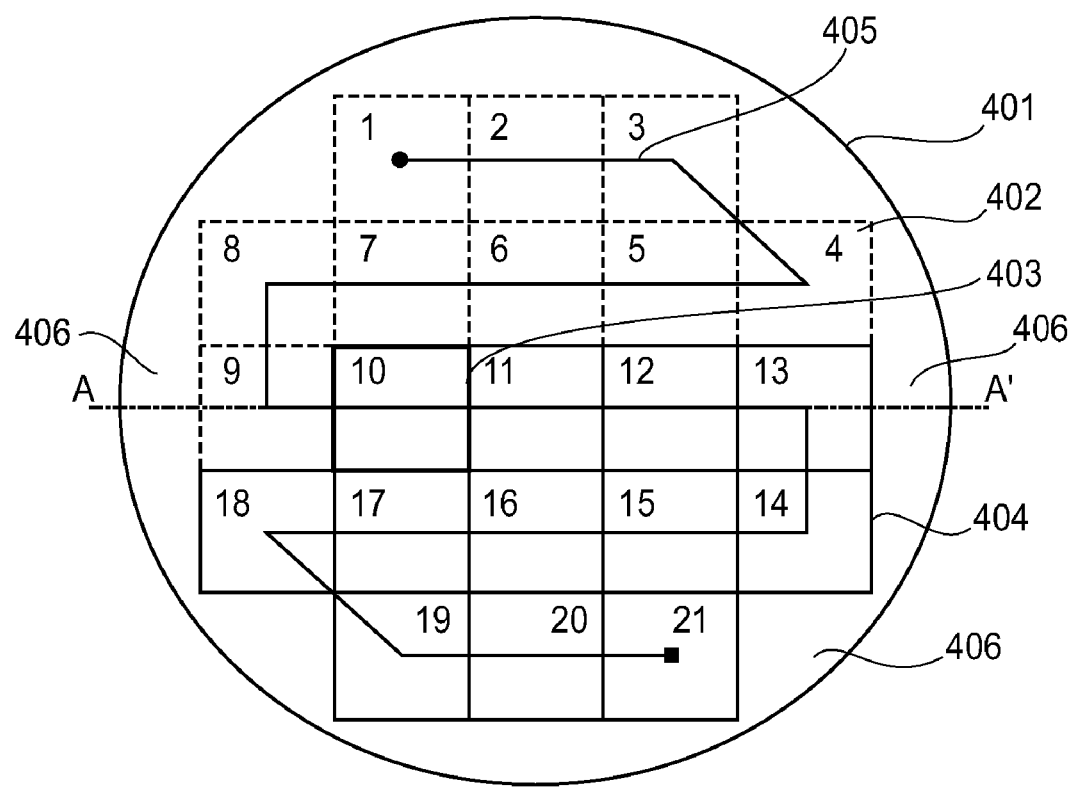
FIG. 4A is a top view for illustrating a procedure for processing a work in an embodiment of the present invention.
Figure 4B:
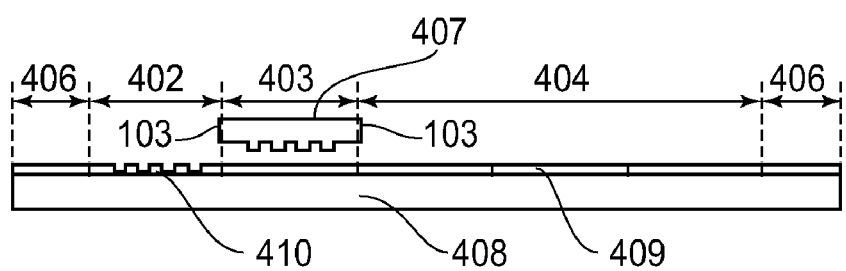
FIG. 4B is a sectional view taken along the A-A' line shown in FIG. 4A.

FIGS. 4A and 4B are schematic views for illustrating a procedure for processing a work, wherein FIG. 4A is a top view and FIG. 4B is a sectional view taken along the A-A' line shown in FIG. 4A.

Referring to FIGS. 4A and 4B, reference numeral 401 represents a work, 407 represents a mold, 408 represents a substrate, 409 represents a photocurable resin material, and 410 represent a cured resin material after an imprint pattern is transferred onto it. On an entire lateral side of the mold 407, a light-blocking member 103 is provided. Further, reference numeral 405 represents a processing path, which is the shortest path for processing. In the work 401, numbers 1 to 21 each represents an area per one shot of processing and the processing of work is performed on the order of an increasing number.

Further, reference numeral 402 indicated by a broken line shows nine areas, No. 1 to No. 9, which have already been processed. Reference numeral 403 indicated by a bold solid line shows a current processing area No. 10. Reference numeral 404 indicated by a solid line shows even unprocessed areas, No. 11 to No. 21. Further, reference numeral 406 represents an unexposed area, in the neighborhood of an edge of the wafer (work), which is not exposed to light even after the processing of the work is completed.

The processing of the work is effected by repetitively performing the XY movement of the work, contacting the mold with the work, exposing the work to light, and removing the mold.

For example, the processing of the work at position No. 10 will be described.

First, the work moved to position No. 10 is brought into contact with the mold or the mold is brought into contact with the work. As a result, the photocurable resin material that cannot be accommodated between the mold and the work flows from the processing side to the outside of the processing side.

Then, only the photocurable resin material within the processing area No. 10 is cured by light exposure. In this case, by using the above-described light-blocking members, it is possible to block the light passing through the processing side of the mold and the non-pattern portion of the mold during light irradiation from the light source. For this reason, the photocurable resin material flowing from the processing side to the outside of the processing side is not exposed to light and is, thus, not cured. As a result, it is possible to prevent the mold and the work from being damaged during the removal of the mold from the water. Further, it is possible to block the light that travels toward the outside of the processing area No. 10, so that areas Nos. 1 to 9 are not excessively exposed to light, and light exposure in unprocessed areas Nos. 11 to 21 can be prevented.

Further, it is possible to decrease a processing margin in the processing area. Accordingly, it is also possible to set a distance of movement of the mold during the processing so as to be equal to the length of one side of the mold. As a result, it is possible to effectively use a planar area of the substrate.

In the case where the resin material itself, which has been cured and formed in an imprint pattern, is used as a structure, the production process of the structure is completed. Further, in the case where the production process of the structure is used in production of a semiconductor device such as LSI, by using the resin material itself, which has been cured and formed in the imprint pattern, as an etching mask, the surface of the underlying substrate is subjected to etching so as to form a recess, such as grooves corresponding to the above-described imprint pattern.

Figure 5A:
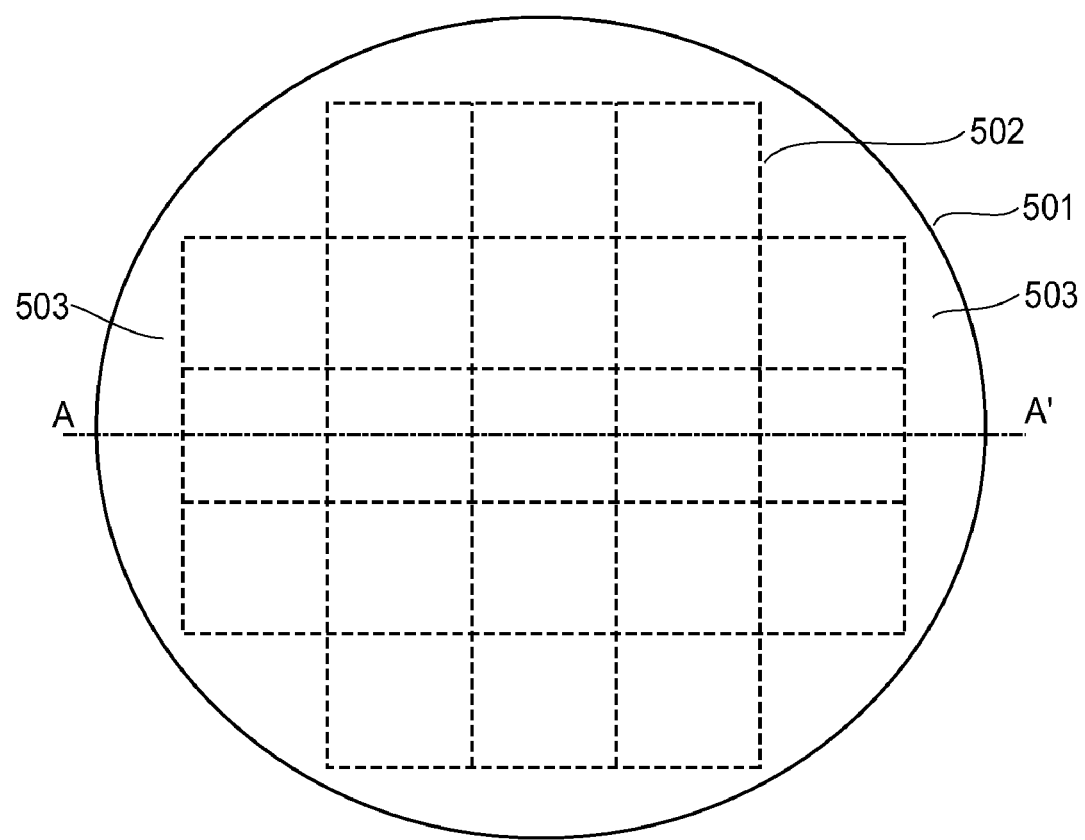
FIG. 5A is a top view showing a work after processing in an embodiment of the present invention.
Figure 5B:
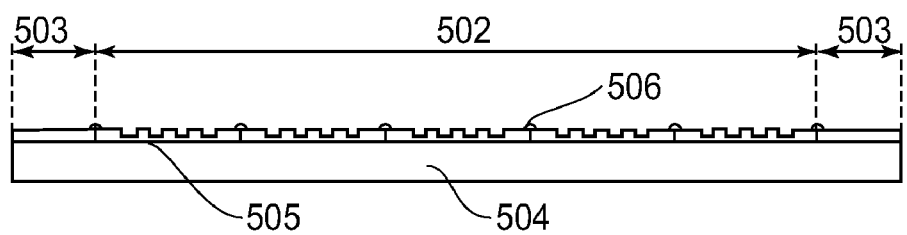
FIG. 5B is a sectional view taken along the A-A' line shown in FIG. 5A.

FIGS. 5A and 5B show the work after the processing is completed. FIG. 5A is a top view of the work and FIG. 5B is a sectional view of the work taken along the A-A' line shown in FIG. 5A.

In these figures, reference numeral 501 represents a work, 502 represents an area after the processing, 503 represents an unexposed area, 504 represents a substrate, 505 represents a cured resin material after a pattern is transferred onto the cured resin material, and 506 represents an uncured resin material, which flows from the processing area to the outside of the processing area during the processing and is located in the neighborhood of the boundary of the processing area without being exposed to light.

The uncured resin materials in the neighborhood of the boundary of the processing area and in the unexposed area adversely affect subsequent steps in some cases. For example, the pattern portion is covered with the uncured resin material, and when the etching is performed in such a state, an etching rate is changed and a desired pattern is not obtained. In order to obviate such an adverse affect, the uncured resin materials can be blown off, removed by washing, or cured by exposure to light.

Incidentally, as the coating method of the photocurable resin material, it is possible to use an ink jet method in which the photocurable resin material is coated on the substrate for each processing area. In the case where the processing is effected by using the ink jet method, a cycle of application of the resin material onto a processing area, XY movement of the work, contact of the mold with the work, light exposure to the work, and removal of the mold from the work is repeated. In this case, on the substrate, there are three areas including an area in which the processing is effected so as to transfer the pattern onto the resin material, an area in which the processing has not yet been effected and the substrate provided with no resin material is exposed, and an area being processed. Even in such a case, by using the light-blocking members in this embodiment, it is possible to prevent irradiation of the area, after the processing is completed, with the exposure light. As a result, the resin material in the processed area can be prevented from being excessively exposed to light.

Here, in the case where the light-blocking member is not provided to the mold or the imprint apparatus, an occurrence of a defect will be described more specifically.

A constitutional example in the case where the light-blocking member is not provided to the mold or the imprint apparatus is shown in each of FIGS. 6A to 6D.

In these figures, reference numeral 601 represents a mold, 602 represents exposure light, 603 represents a substrate, 604 represents a resin material, 605 represents a resin material flowing from the mold 601 to the outside of the mold 601, 606 represents a processing area in which the mold 601 has been successfully removed from the substrate 603. The processing area 606 includes a mold area 607 and margin area 608. The margin area 608 is a minimum area, located outside the mold 601, in which the resin material is cured by exposure to light.

Figure 6A:
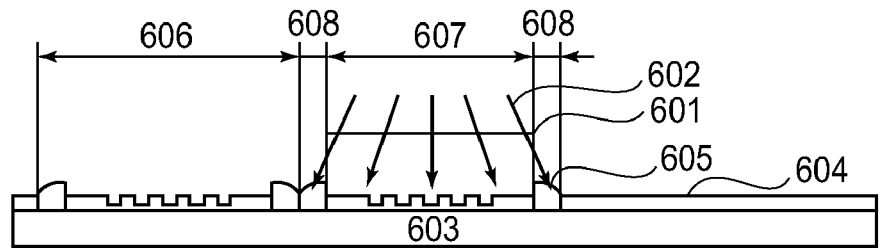
FIGS. 6A to 6D are schematic views for illustrating an occurrence of deficiency in the case where a light-blocking member is not provided.

FIG. 6A shows a light exposure process. The exposure light is radially diverged from the light source and passes through the inside of the mold, so that the outside of the mold is irradiated with the exposure light. As a result, the resin material is exposed to light in not only the mold area, but also in the margin area.

The defect in such a constitution will be described below.

The pattern has a depth (thickness) on the order of approximately 100 nm, but the thickness of the resin material flowing outside the mold sometimes amounts to several millimeters. When such a resin material is cured, it is possible for a part or all of the resin material on the substrate to be removed due to the thin layer of resin material on the substrate. Further, when the amount of the exposure light is small and, thus, the resin material is not sufficiently cured, the resin material is attached to the mold and can be dropped from the mold during the movement of the mold to result in a defect.

A specific example the defect will be described with reference to FIGS. 6B to 6D.

Figure 6B:
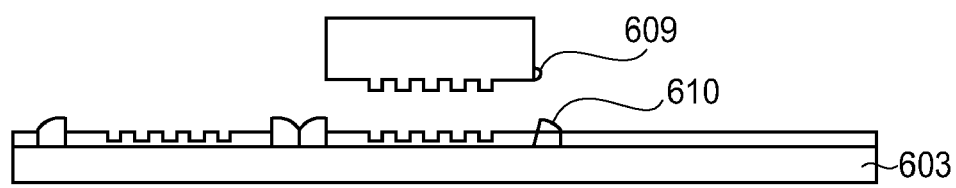

FIG. 6B shows an example in which a small resin material piece 609 is separated from a resin material 610 and attached to the mold. Such a resin material piece 609 is sometimes dropped from the mold onto the work during the processing. When the dropped resin material piece 609 is sandwiched between the work and the mold and deposited on the processing side of the mold, from then on, the processing apparatus has a defect.

Figure 6C:
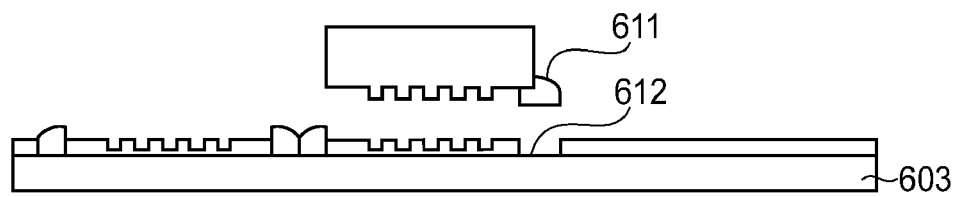

FIG. 6C shows an example in which a large resin material piece 611 is removed from the substrate 603, so that a surface 612 of the substrate 603 is exposed. In this case, the resin material piece 611 is cured and a defect occurs in subsequent areas.

Figure 6D:
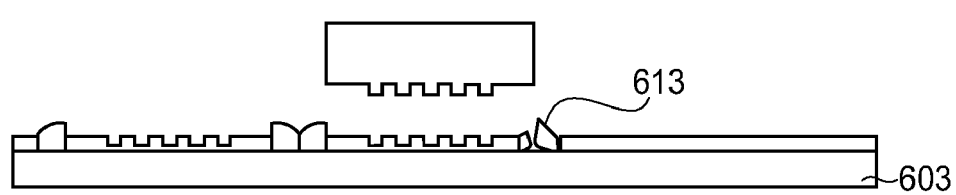

FIG. 6D shows an example in which a resin material portion 613 is partially raised from the substrate 603 in an area. When this area is a margin area, the resin material portion 613 is a limitative defect.

In the cases shown in FIGS. 6B to 6D, according to the embodiments of the present invention, it is possible to prevent the curing of the resin material located at a peripheral portion of the processing area of the mold, thus preventing an occurrence of a defect, etc.

While the invention has been described with reference to the structures disclosed herein, it is not confined to the details set forth above, and this application is intended to cover such modifications or changes as may come within the purpose of the improvements or the scope of the following claims.

This application claims priority from Japanese Patent Application No. 257431/2005, filed Sep. 6, 2005, which is hereby incorporated herein by reference.

What is claimed is:

1. An imprint apparatus for processing a photocurable member to be processed by irradiating the photocurable member to be processed, through a mold having an imprint pattern, with light for curing the member to be processed in a state in which the mold is brought into contact with the member to be processed, said apparatus comprising:

a light source for generating the light;

a mold holding portion for holding a back surface of the mold opposite from a processing surface of the mold; and a body tube, provided between said light source and said mold holding portion, having a lateral side inside an outer edge of the member to be processed with respect to a horizontal direction, wherein said apparatus further comprises a light-blocking member for decreasing an amount of light with which the member to be processed is irradiated from said light source not through the mold, and wherein said light-blocking member is provided on a lateral side of said mold holding portion, on a surface of said mold holding portion opposing said photocurable member, and on the lateral side of said body tube.

2. An apparatus according to claim 1, further comprising a controller for controlling said light source, a contacting mechanism for pressing the mold against the member to be processed, and a moving mechanism for moving the member to be processed so as to repetitively process the member to be processed by a step-and-repeat method.

* * * * *